United States Patent [19]

Fujii et al.

[11] Patent Number: 5,544,176

[45] Date of Patent: Aug. 6, 1996

[54] INFORMATION RECORDING APPARATUS WHICH ELIMINATES UNNECESSARY DATA BEFORE RECORDING

[75] Inventors: Akio Fujii, Yokohama; Motokazu Kashida, Musashino; Ikuo Watanabe, Kawasaki; Shinichi Yamashita, Yokohama, all of Japan

[73] Assignee: Canon Kabushiki Kaisha, Tokyo, Japan

[21] Appl. No.: 250,940

[22] Filed: May 31, 1994

Related U.S. Application Data

[63] Continuation of Ser. No. 653,896, Feb. 12, 1991, abandoned.

[30] Foreign Application Priority Data

Feb. 13, 1990 [JP] Japan .................................. 2-31721
Feb. 14, 1990 [JP] Japan .................................. 2-34452
Feb. 7, 1991 [JP] Japan .................................. 3-016633

[51] Int. Cl.⁶ .......................... G11B 20/12; H04N 1/64
[52] U.S. Cl. .................... 371/40.1; 348/390; 348/423; 360/35.1; 360/48
[58] Field of Search .......................... 371/40.1; 358/133, 358/342, 426, 431, 310, 335; 360/35.1, 48; 348/384, 390, 423

[56] References Cited

U.S. PATENT DOCUMENTS

| | | | |
|---|---|---|---|
| 3,666,888 | 5/1972 | Sekimoto | 358/136 |
| 4,280,192 | 7/1981 | Moll | 364/900 |
| 4,353,090 | 10/1982 | Broadbent | 358/342 |
| 4,412,306 | 10/1983 | Moll | 364/715.02 |
| 4,751,572 | 6/1988 | Baumbaugh et al. | 358/133 |
| 4,777,537 | 10/1988 | Ueno, et al. | 358/341 |
| 4,843,484 | 6/1989 | Kanamaru, et al. | 358/342 |
| 4,866,719 | 9/1989 | Morgan et al. | 371/40.1 |
| 4,914,515 | 4/1990 | Van Luyt | 358/345 |
| 4,931,879 | 6/1990 | Koga et al. | 358/335 |
| 5,006,939 | 4/1991 | Cawley | 360/14.1 |
| 5,020,058 | 5/1991 | Holden et al. | 370/109 |
| 5,027,230 | 6/1991 | Nakayama | 360/35.1 |
| 5,047,868 | 9/1991 | Takeda et al. | 358/335 |
| 5,050,003 | 9/1991 | Horii, et al. | 358/342 |

(List continued on next page.)

OTHER PUBLICATIONS

White, J. et al., "Higher Level Protocols Enhance Ethernet", *Electronic Design*, Apr. 15, 1982, pp. ss33–ss41.

Estrin, J. et al., "Gateways Promise to Link Local Networks into Hybrid Systems" *Electronics*, Sep. 22, 1982, pp. 145–150.

Cunningham, I. et al., "Electronic Mail Standards to Get Rubber–Stamped and Go Worldwide", *Data Communications*, May 1984.

Jacobson, D. et al., "A Master/Slave Monitor Measurement Technique for Operating Ethernet Network", *IEEE Network*, vol. 1, No. 3, Jul. 1987, pp. 40–48.

Zett, J., "Evaluating and Testing LAN Performance", *Telecommunications Products + Technology*, Aug. 1987, pp. 40–44.

Barnett, B. et al., "LANCET: Local Area Network Comprehensive Evaluation Tool", *Computer Networking Symposium*, 1988, pp. 340–347.

Stallings, W., *Local Networks*, 3rd ed., Macmillan Pub. Co., 1990, pp. 142–149, 162–165.

Primary Examiner—Stephen M. Baker
Attorney, Agent, or Firm—Fitzpatrick, Cella, Harper & Scinto

[57] ABSTRACT

An information recording apparatus records data, which is in the format of packets received by broadcast, on a recording medium having a write/read capability. If the received data contains any unnecessary items of data that can be reproduced later, these items of data are eliminated at the time of recording on the recording medium. At playback, the eliminated items of data are restored and appended to the data read in from the recording medium. The resulting data, which is substantially the same as that in the packets received by broadcast, is outputted to a playback apparatus capable of reproducing the broadcast.

20 Claims, 9 Drawing Sheets

U.S. PATENT DOCUMENTS

| | | | |
|---|---|---|---|
| 5,122,886 | 6/1992 | Tanaka | 358/335 |
| 5,130,813 | 7/1992 | Oie, et al. | 358/335 |
| 5,136,391 | 8/1992 | Minami | 358/310 |
| 5,136,394 | 8/1992 | Haikawa et al. | 355/335 |
| 5,136,395 | 8/1992 | Ishii, et al. | 358/335 |
| 5,249,065 | 9/1993 | Juso et al. | 358/335 |
| 5,434,568 | 7/1995 | Moll | 341/87 |

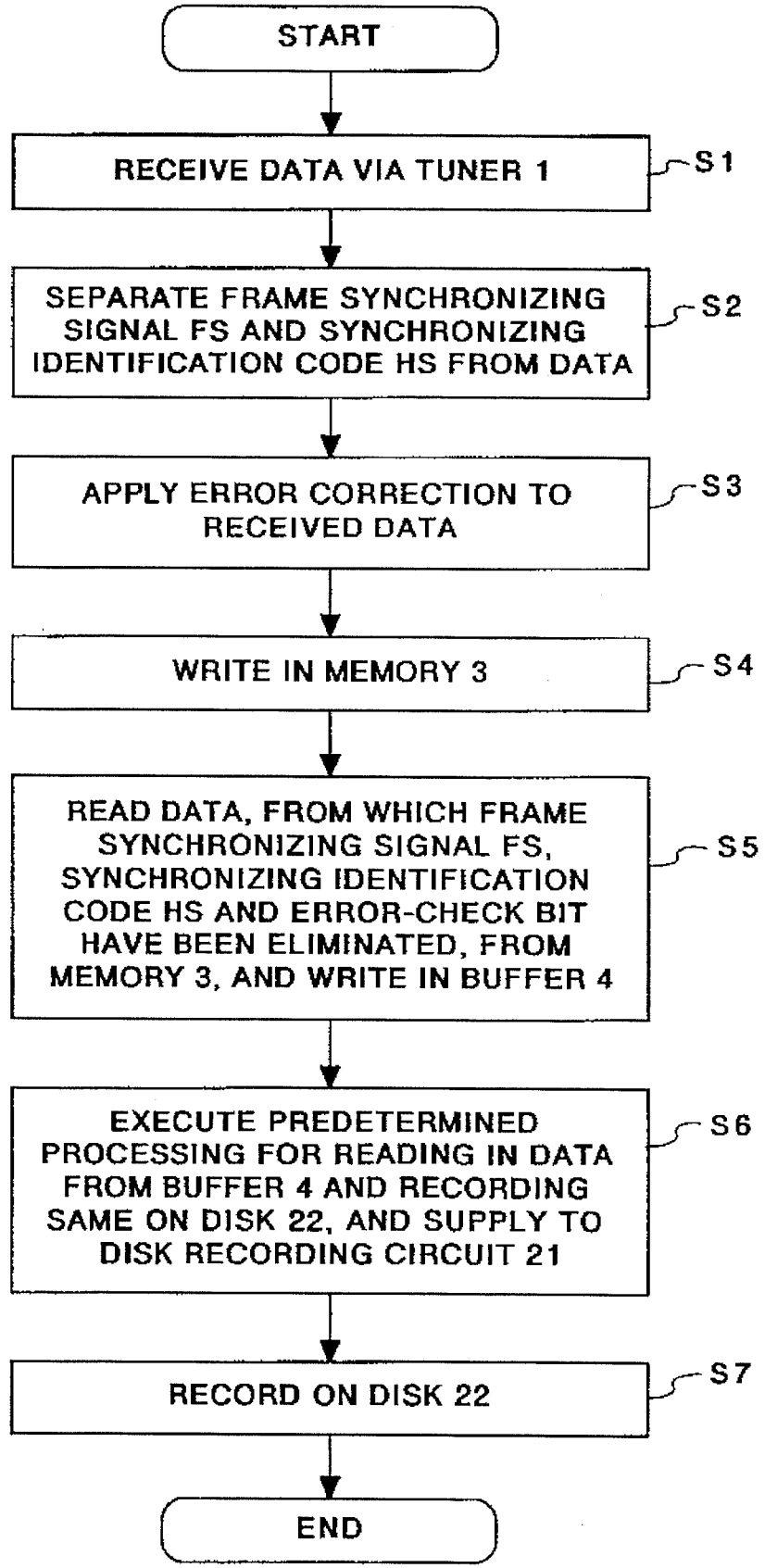
F I G. 5

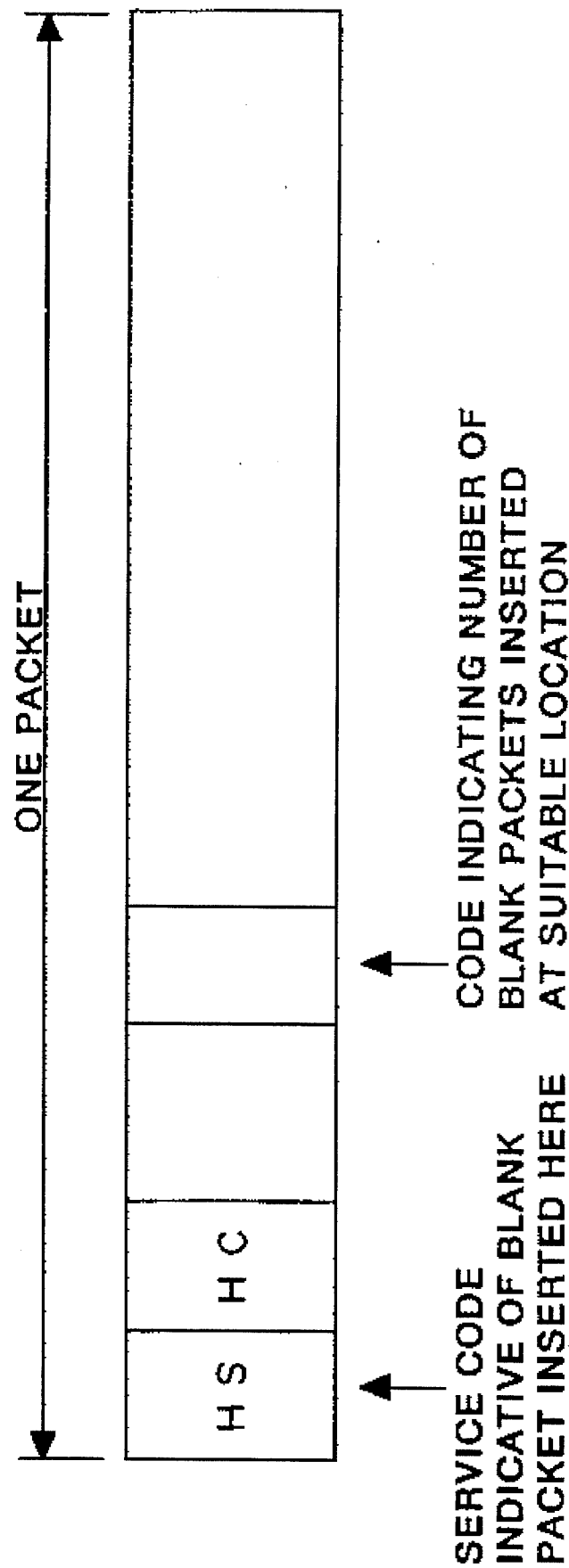

INFORMATION RECORDING APPARATUS WHICH ELIMINATES UNNECESSARY DATA BEFORE RECORDING

This application is a continuation of U.S. patent application Ser. No. 07/653,896 filed Feb. 12, 1991, now abandoned.

BACKGROUND OF THE INVENTION

This invention relates to an information recording/playback apparatus and, more particularly, to an information recording/playback apparatus for recording and reproducing still-picture information that has been received.

A high-definition television signal (hereinafter referred to as a HDTV signal) has a large number of scanning lines and presents a very fine image. For these reasons, it is expected that such a signal will find use in the transmission of still pictures, e.g., the transmission of works of art such as paintings, animations, still pictures for medical purposes, for merchandise catalogues and the like.

In a case where a still picture is transmitted as a broadcast wave, as described above, it has been contemplated to compress the picture to a degree that will not diminish picture quality, and to annex thereto a synchronizing signal and an error-check code (hereinafter abbreviated to ECC). Though various media are usable for storing the still picture on the receiving side, a disk-shaped recording medium generally is suitable in terms of its random-access capability, cost and recording capacity.

FIG. 2 is a diagram illustrating the construction of a system for a case where it is assumed that a still-picture signal transmitted as set forth above is received and recorded on a disk-shaped recording medium, with use being made of an ordinary technique. As shown in FIG. 2, numeral 1 denotes a tuner which receives a still-picture information code that has been transmitted as a broadcast wave, and which extracts the code as an electric signal. An ECC decoding circuit 2 is for decoding the ECC annexed to the still-picture code extracted by the tuner 1, and for performing error correction. A buffer 4 transmits the corrected still-picture code to a bus A functioning as an address/data bus.

A microprocessing unit (MPU) 40 carries out an exchange of information data and address data with each of various devices via the bus A. The still-picture data transmitted to the bus A via the buffer 4 is read into the MPU 40, in which the data is put into the form of a code suitable for recorded data, after which the code is accepted by a disk recording circuit 21 via the bus A.

The disk recording circuit 21 subjects the still-picture code processed by the MPU 40 to such processing as modulation necessary for recording, and supplies its output to a disk device 22. The latter records the still-picture signal on the disk-like recording medium.

The still-picture signal reproduced from the disk-shaped recording medium inside the disk device 22 is converted into a code by a disk playback circuit 23. The code is supplied via the extended bus A to the MPU 40, where the code is returned to the form of the original code. The MPU 40 supplies the still-picture information code, which as been returned to the originally coded form, to the buffer 13 via the bus A. This still-picture information code is outputted from an output terminal 17 via the buffer 13, thereby to be supplied to a monitor unit or the like having an internal decoder for decoding the compressed code.

In the system described above, various codes necessary for a transmission in the form of broadcast waves are annexed to the still-picture information code data. Accordingly, in a case where such transmission code data is recorded on a disk-shaped recording medium, the recording medium is required to have a large capacity even if a small number of still pictures are recorded.

SUMMARY OF THE INVENTION

Accordingly, an object of the present invention is to provide an information recording apparatus in which a large amount of information can be recorded on a recording medium by eliminating at least the error-check code required until the time of reception.

According to the present invention, the foregoing object is attained by providing an information recording apparatus for receiving information which includes main information as well as error-check code information for correcting errors in the main information, and for recording the received information on a recording medium, the apparatus comprising: checking means for checking errors in the main information based upon the error-check code information; eliminating means for eliminating the error-check code information in packets corrected by the checking means; and recording means for recording main information, which is obtained by eliminating the error-check code information by the eliminating means, on the recording medium.

Another object of the present invention is to provide an information recording apparatus in which a large amount of information can be recorded on a recording medium, and reproduced from the recording medium, by eliminating at least the error-check code required until the time of reception.

According to the present invention, the foregoing object is attained by providing an information recording and reproducing apparatus for receiving information which includes main information as well as error-check code information for correcting errors in the main information, for recording the received information on a recording medium having an information read/write capability, and for reproducing and outputting the recorded information, the apparatus comprising: checking means for correcting errors in the main information based upon the error-check code information; eliminating means for eliminating the error-check code information in packets corrected by the checking means; recording means for recording the main information, which is obtained by eliminating the error-check code information by the eliminating means, on the recording medium; reading means for reading the information recorded by the recording means; information reproducing means for generating error-check code information, which corresponds to the main information contained in the information read by the reading means; and output means for outputting the information, which has been reproduced by the reproducing means, to a reproducing unit.

Another object of the present invention is to provide an information recording apparatus in which a large amount of information can be recorded on a recording medium by recording only received data packets that are effective for the apparatus.

According to the present invention, the foregoing object is attained by providing an information recording apparatus for receiving information, in the form of packets, and for recording the received information on a recording medium, the apparatus comprising: discriminating means for discriminating, whether a packet of interest is an effective packet, which includes useful data, or an ineffective packet; counting means for counting ineffective packets in an interval during which packets have been discriminated to be ineffective packets by the discriminating means; and recording means for successively recording, on the recording medium, data in packets discriminated to be effective packets by the discriminating means, as well as a counted value of ineffective packets counted by the counting means.

A further object of the present invention is to provide an information recording apparatus in which a large amount of information can be recorded on a recording medium, and reproduced from the recording medium, by recording only received data packets that are effective for the apparatus.

According to the present invention, the foregoing object is attained by providing an information recording apparatus for receiving, in the form of packets, information which includes main information as well as identification information to identify the main information, and for recording the received information on a recording medium having an information read/write capability, the apparatus comprising: discriminating means for discriminating, based upon the identification information, whether a packet of interest is an effective packet, which possesses useful data, or an ineffective packet; counting means for counting ineffective packets in an interval during which packets have been discriminated to be ineffective packets by the discriminating means; recording means for successively recording, on the recording medium, data in packets discriminated to be effective packets by the discriminating means, as well as a counted value of ineffective packets counted by the counting means; reading means for successively reading information from the recording medium; and output means for generating ineffective packets in a number equivalent to the counted value when the counted value of ineffective packets is contained in the read information, inserting the generated ineffective packets at positions where the ineffective packets existed, and successively outputting these packets to a prescribed reproducing unit.

Still another object of the present invention is to provide an information recording apparatus in which a large amount of information can be recorded on a recording medium by recording only received data packets that are effective for the apparatus and eliminating error-check code information from the packets.

According to the present invention, the foregoing object is attained by providing an information recording apparatus for receiving, in the form of packets, information which includes main information, error-check code information for correcting errors in the main information, and identification information to identify the main information, and for recording the received information on a recording medium having an information read/write capability, the apparatus comprising: error-check means for correcting errors in the main information based upon the error-check code information; discriminating means for discriminating, based upon the identification information, whether a received packet is an effective packet, which possesses useful data, or an ineffective packet; counting means for counting ineffective packets in an interval during which packets have been discriminated to be ineffective packets by the discriminating means; eliminating means for eliminating the error-check code information in effective packets discriminated to be effective packets by the discriminating means and corrected by the error-check means; and recording means for successively recording, on the recording medium, information from which the error-check code information has been eliminated, as well as a counted value of ineffective packets counted by the counting means.

Yet another object of the present invention is to provide an information recording apparatus in which a large amount of information can be recorded on a recording medium, and reproduced from the recording medium, by recording only received data packets that are effective for the apparatus and eliminating error-check code information from the packets.

According to the present invention, the foregoing object is attained by providing an information recording apparatus for receiving, in the form of packets, information which includes main information, error-check code information for correcting errors in the main information, and identification information to identify the main information, and for recording the received information on a recording medium having an information read/write capability, the apparatus comprising: error-check means for correcting errors in the main information based upon the error-check code information; first discriminating means for discriminating, based upon the identification information, whether a received packet is an effective packet, which possesses useful data, or an ineffective packet; counting means for counting ineffective packets in an interval during which packets have been discriminated to be ineffective packets by the first discriminating means; eliminating means for eliminating the error-check code information in effective packets discriminated to be effective packets by the first discriminating means and corrected by the error-check means; recording means for successively recording, on the recording medium, information from which the error-check code information has been eliminated, as well as a counted value of ineffective packets counted by the counting means; reading means for successively reading information from the recording medium; second discriminating means for discriminating whether the information read by the reading means is data that has been subjected to correction processing by the error-check means the counted value of ineffective packets; first packet generating means which, when the second discriminating means has discriminated that the read information is the data that has been subjected to correction processing, generates error-check code information corresponding to the read information, and generates one packet; second packet generating means which, when the second discriminating means has discriminated that the read information is the counted value of ineffective packets, generates ineffective packets the number of which is equal to the counted value; and output means for outputting the packets, which have been generated by the first and second packet generating means, to an externally located, prescribed reproducing unit in accordance with a sequence in which the information has been read by the reading means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5 is a flowchart showing the procedure of recording processing according to the first embodiment;

FIG. 10 is a diagram illustrating a data format for recording counting of ineffective packets.

DESCRIPTION OF THE PREFERRED EMBODIMENTS

Preferred embodiments of the present invention will now be described with reference to the drawings.

Figure 1:
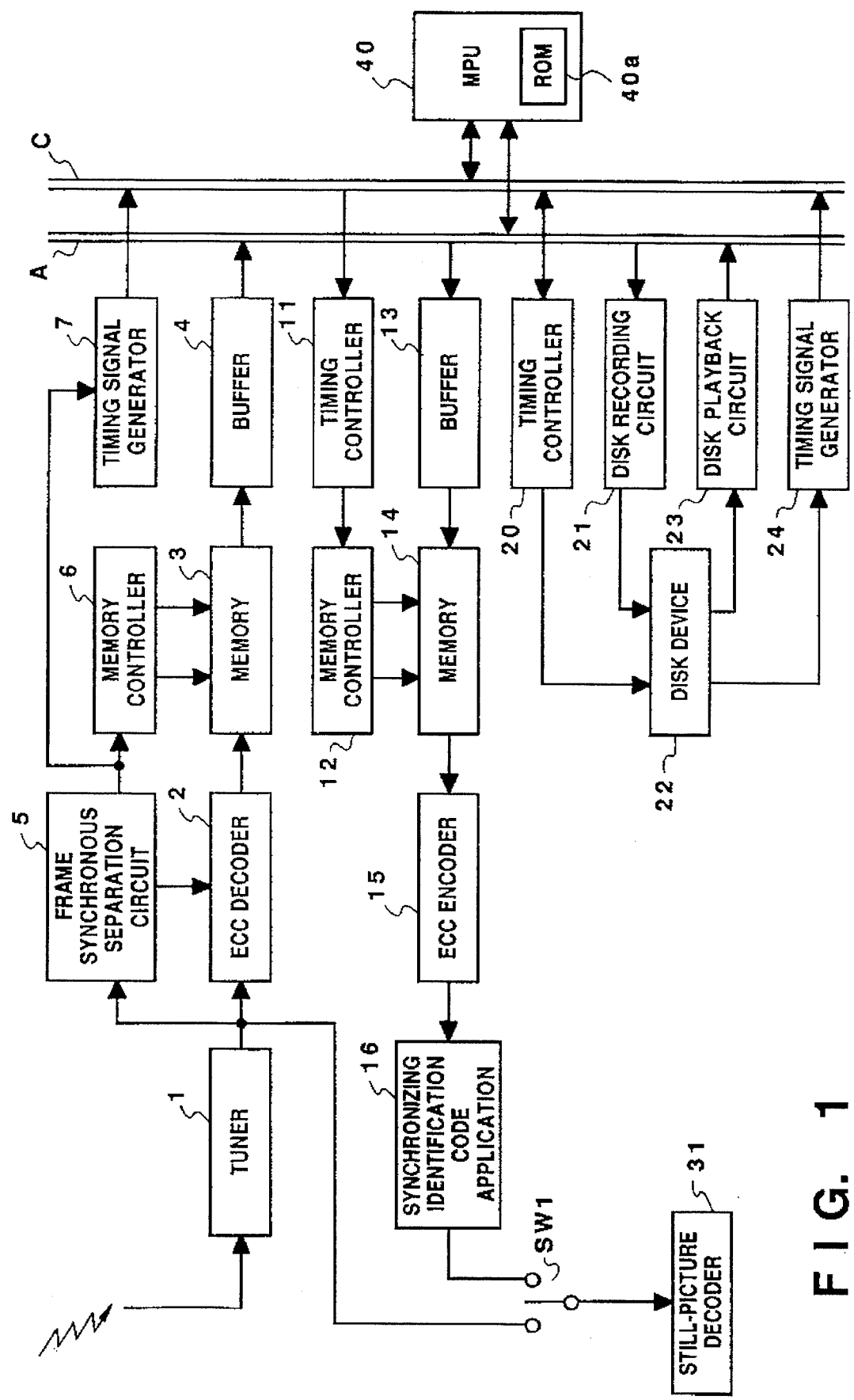
FIG. 1 is a block diagram illustrating a first embodiment of an information recording apparatus.
Figure 2:
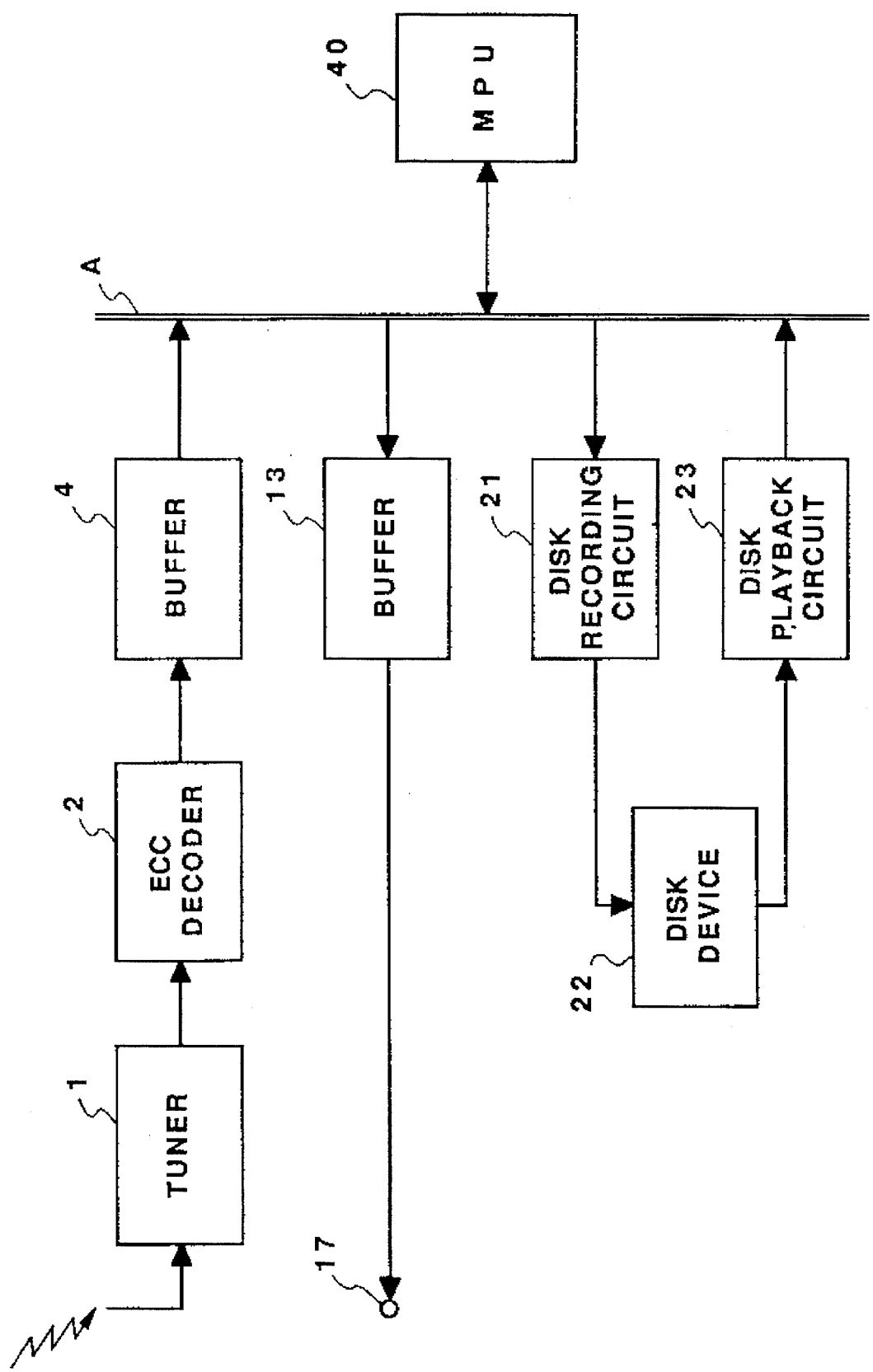
FIG. 2 is a block diagram illustrating the construction of a system for a case where it is assumed that a still-picture signal transmitted as set forth above is received and recorded on a disk-shaped recording medium, with use being made of an ordinary technique.
Figure 3:
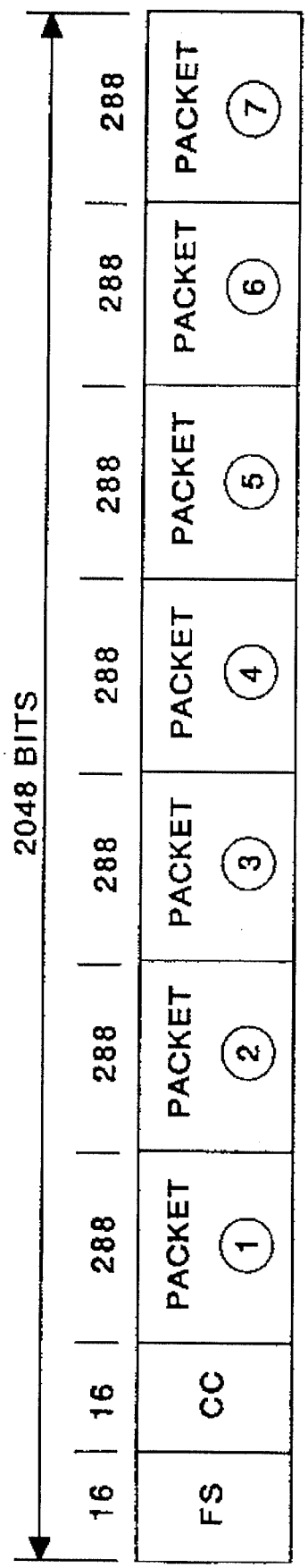
FIG. 3 is a diagram illustrating the format of received data in the embodiment.
Figure 4:
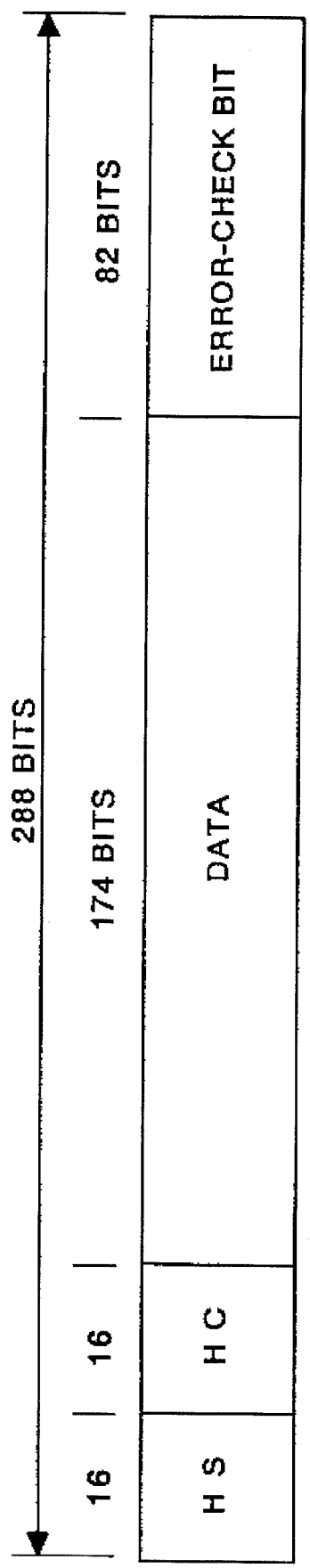
FIG. 4 is a diagram illustrating the contents of each of a number of packets shown in FIG. 3.

FIG. 1 is a block diagram showing the construction of a recording/playback apparatus for recording and reproducing still-picture information and audio information in a first embodiment of the present invention. FIGS. 3 and 4 are diagrams useful in describing the transmission format of transmission codes for a still picture and audio to be recorded in the apparatus of FIG. 1. Portions in FIG. 1 that are identical with those in FIG. 2 are designated by like reference characters.

As shown in FIG. 3, the transmission codes of a still picture and audio to be recorded in this embodiment are assumed to be transmitted in packet-data format. In FIG. 3, FS represents a 16-bit frame synchronizing code and CC a 16-bit frame control code. The frame control code CC indicates the contents of main information codes contained in the packets ① through ⑦ that follow it, as well as the array of these codes. As shown in FIG. 3, one frame includes seven packets each comprising 288 bits, for a total of 2048 (=16+16+288×7) bits.

The code arrays of the packets ① through ⑦ are the same, one of which is shown in FIG. 4. In FIG. 4, HS represents a 16-bit synchronizing identification code (synchronizing identification information) which forms the header portion of each packet. The synchronizing identification code HS indicates the beginning portion of each packet as well as the type of information (mode) transmitted by this code string. HC represents a 16-bit header control code attribute information which indicates the contents of the information code with regard to each packet. In this embodiment, the header control code HC is a still-picture information code or an audio information code and includes a code for synchronizing these. The synchronizing identification code HS and header control code HC are immediately followed by data which is a 174-bit main information code and then by error-check bits composed of 82 bits. Thus, one packet is composed of 288 bits.

In the recording/playback apparatus of this embodiment, the frame synchronizing code FS, the synchronizing identification code HS and the error-check bits of 82 bits are deleted from the abovementioned code string before the code string is recorded. The reason is that the frame synchronizing code FS and synchronizing identification code HS are codes for code synchronization or code identification in a transmission line. These codes are unnecessary at the time of recording/playback or do not require a large number of bits. In addition, the mode information contained in the synchronizing identification code HS is unnecessary if the recording/playback apparatus of this embodiment is used exclusively for recording/playback of still pictures and audio. Furthermore, with regard to the deletion of ECC (error-check code), the data should have a code, which is suitable for correcting an error that is produced in the broadcast-wave transmission line, annexed to it, but an ECC of this kind is not necessary for use at the time of recording/playback.

The operation of the apparatus in this embodiment at the time of recording will now be described in accordance with the flowchart of FIG. 5. The recording operation set forth hereinbelow is executed when recording is designated by the operator using a control panel, which is not shown. The control program for executing the processing described below has been stored in a ROM located within the MPU 40.

The information code string received via the tuner 1 enters the ECC decoding circuit 2 and a frame synchronous separation circuit 5 (step S1). The frame synchronous separation circuit 5 separates a frame synchronizing signal FS and the synchronizing identification code HS in each packet from the entered code and outputs the separated results to a memory control circuit 6 and a timing signal generating circuit 7 and the ECC decoding circuit 2 (step S2). The ECC decoding circuit 2 decodes the ECC appended to the entered code and applies an error correction to the main information (step S3). After this error correction processing has been executed, the data is written in a memory 3 at a predetermined address thereof (step S4).

On the basis of a timing signal from the frame synchronous separating circuit 5, the memory control circuit 6 sequentially accesses the memory 3 from the predetermined address and transfers the already written data to the buffer 4. However, in order that the frame synchronizing signal FS, synchronizing identification code HS and ECC contained in the data written in memory 3 will not be read out, the memory control circuit 6 transfers data other than FS, HS and ECC to the buffer 4 (step S5). It should be noted that an arrangement can be adopted in which the aforementioned FS, HS and ECC are deleted when the data processed by the ECC decoder 2 is written in the memory 3. In any case, after the data with the exception of the frame synchronizing signal FS, synchronizing identification code HS and ECC has been written in the buffer 4, this data is transmitted to the extended bus A. At this time, in accordance with the frame synchronizing signal FS and synchronizing identification code HS, a timing signal generating circuit 7 transmits, to a control bus C, a timing signal which indicates the timing at which the code of the beginning of the frame and the code of the beginning of each packet are transmitted from the buffer 4 to the extended bus A.

Upon receiving the timing signal from the timing signal generating circuit 7, the MPU 40 itself accepts the still-picture/audio code data transmitted to the extended bus A and executes processing suitable for storing the data in the disk device 22. A timing signal, which returns the code of the beginning of the frame and the code of the beginning of each packet to the extended bus A, is transmitted to the control bus C and the data is sent out on the expansion data bus A. The still-picture/audio codes sent from the MPU 40 are read in by the disk recording circuit 21 via the extended bus A, and this transmission timing signal is accepted by the timing control circuit 20. The disk recording circuit 21 applies modulating processing and the like necessary for recording to the still-picture/audio codes processed by the MPU 40, and applies the result to disk device 22. The latter records the information on its internal storage medium based upon the modulated signal (step S7). The recording position at this time is controlled by the disk recording circuit 21. For example, the information is recorded upon being divided into sectors every frame or every packet.

Figure 6:
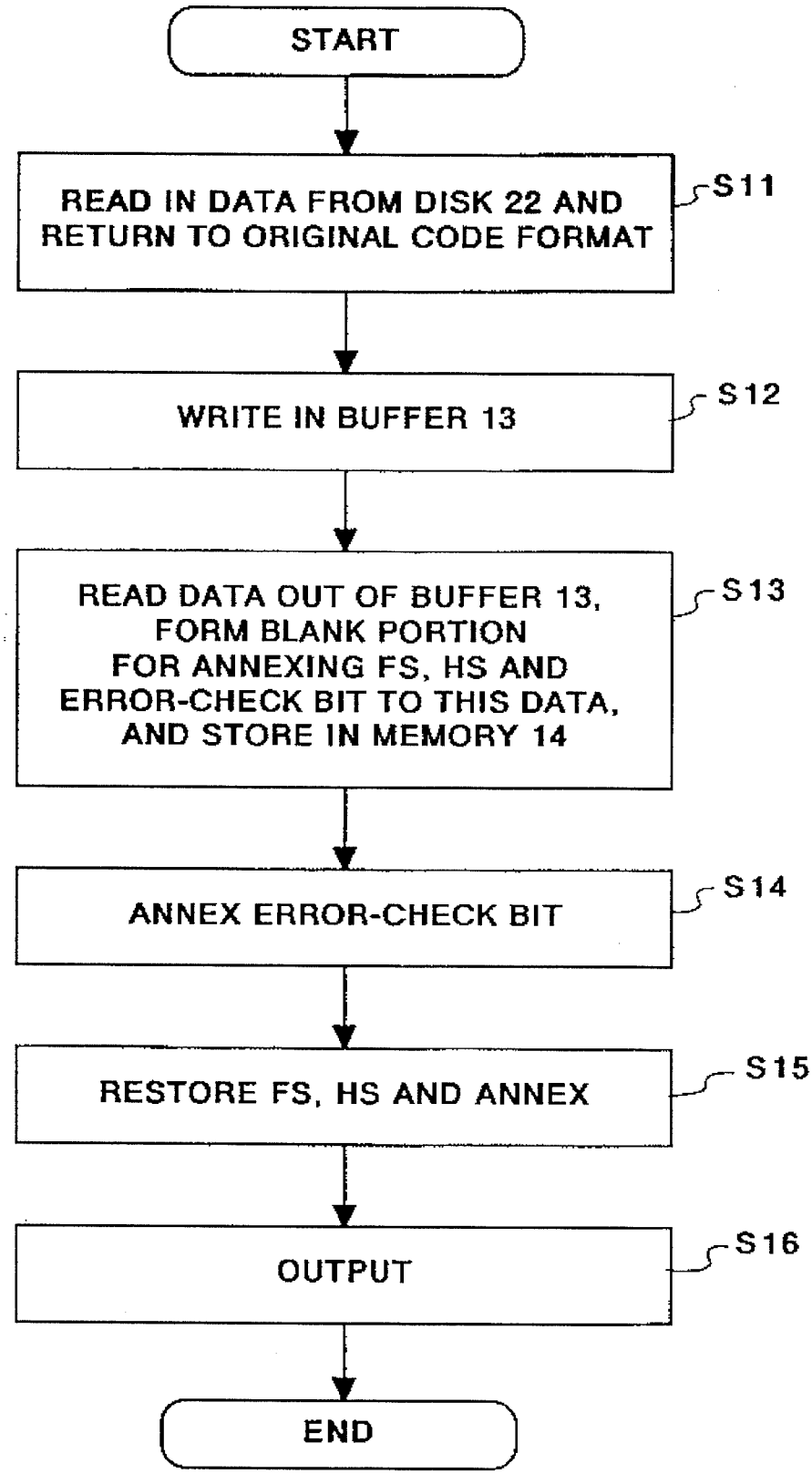
FIG. 6 is a flowchart showing the procedure of playback processing according to the first embodiment.

An operation which prevails when information recorded in the disk device 22 is reproduced will be described in accordance with the flowchart of FIG. 6.

When the MPU 40 detects that the operator has designated playback via the control panel, the MPU 40 outputs a signal commanding playback to the disk playback circuit 23. In response, the latter converts the still-picture/audio signals read out of the disk device 22 into codes. At this time a timing signal generating circuit 24 detects each packet or the beginning portion of each frame by virtue of the form of sector division and, in accordance with the timing at which these are outputted from the playback circuit 23 to the extended bus A, transmits a signal indicative thereof to the control bus C. In response to receipt of this timing signal, the MPU 40 accepts the still-picture/audio codes sent by the disk playback circuit 23 and returns these codes to their original form (i.e., to the data of the form which prevailed at read-out from the buffer 4 at the recording stage) (step S11).

The still-picture/audio codes, which are obtained by being returned to their original form, are transmitted to the buffer 13 via the extended bus A, and a timing signal, which indicates the timing at which each packet or the beginning portion of each frame is transmitted, is sent to a timing control circuit 11 via the control bus C (step S12).

The still-picture/audio codes that have been stored in the buffer 13 are written in the memory 14 under the control of a memory control circuit 12. On the basis of the timing signal from the timing control circuit 11, the memory control circuit 12 controls, in relative terms, the write/read timing of the codes with respect to the memory 14 (step S13). That is, upon taking into consideration the outputting of the code strings shown in FIGS. 3 and 4, the memory control circuit 12 reads the codes out of the buffer 12 and stores them in the memory 14. More specifically, since the data has been written in the buffer 13 in a form from which the frame synchronizing code FS, the synchronizing identification code HS of every packet and the 82-bit ECC have been deleted, a blank space of a size in which these items of data are inserted is formed in the memory 14.

The code string in which the blank portion free of codes is thus formed is supplied to an ECC encoding circuit 15, and an ECC similar to the ECC annexed to the transmitted code string is annexed to the corresponding blank portion. Next, a circuit 16, which is for annexing a synchronizing identification code, restores the frame synchronizing code FS and synchronizing identification code HS and annexes these to the corresponding blank portion (step S15). Thus, the circuit 16 outputs a signal substantially the same as the code string received by the tuner 1 (step S16). The still-picture/audio codes from the tuner 1, or which have been obtained by playback processing, are supplied to a still-picture decoder 31. The latter 31 expands the inputted still-picture/audio codes and supplies them to a monitor (not shown) in accordance with the synchronizing signal contained in the data. As a result, the data is reproduced so as to be perceptible by human beings.

It goes without saying that a switch SW1 in FIG. 1 is set to the side of the circuit 16 at the time of playback. The switch SW1 can be of the manual type operated by the user or of a type capable of being changed over automatically under the control of the MPR 40. It is assumed here that the control program for realizing the foregoing processing (FIGS. 5 and 6) has been stored in the ROM of MPU 40.

Thus, in accordance with the apparatus of this embodiment as described above, a code recorded in the disk device 22 is actually one in which the frame synchronizing code FS, the synchronizing identification code HS in each packet and the 82-bit ECC have been deleted from the transmitted code that has been received. It will be appreciated, therefore, that the amount of information has been reduced. In other words, this makes it possible for the disk device 22 to record and reproduce a greater amount of information.

In actuality, the 16 bits of the frame synchronizing code FS, the 16 bits of the code HC in each of the seven packets, and the 82 bits of the ECC are deleted. Accordingly, in terms of one frame, information composed of a total of 702 bits [=16+(16 +82)×7] is deleted. Thus, the amount of information can be reduced to less than two-thirds of the information in one received frame.

Figure 7:
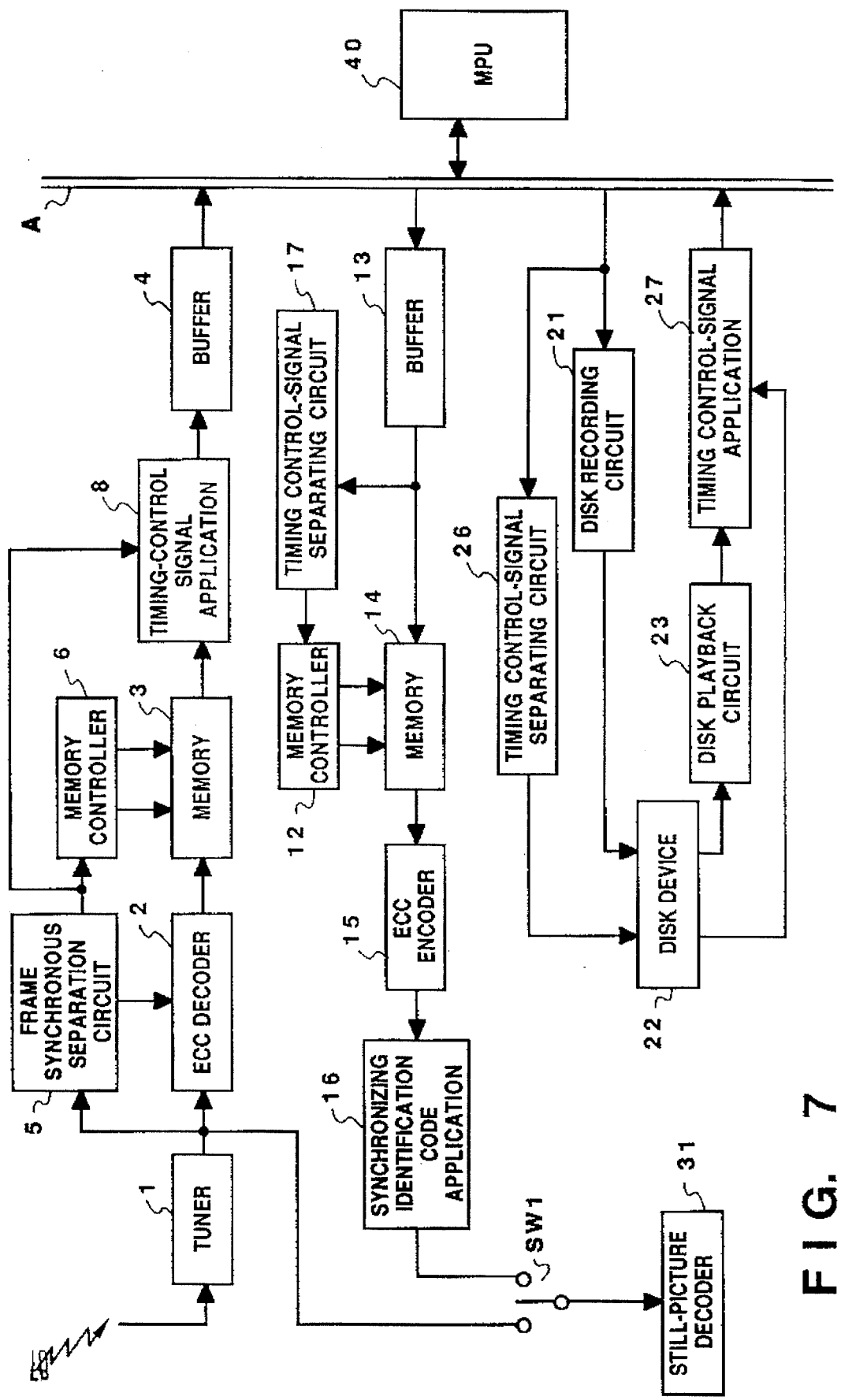
FIG. 7 is a block diagram illustrating a second embodiment of an information recording apparatus.

FIG. 7 is a block diagram illustrating the construction of a still-picture/audio recording/playback apparatus according to a second embodiment of the present invention. Components similar to those shown in FIG. 1 are designated by like reference characters and need not be described again.

In the apparatus of FIG. 7, an exchange of the aforementioned timing signals is achieved without using the control bus C. At the time of recording, a control signal of four to eight bits is applied, instead of the frame synchronizing signal, to the code string transmitted from the buffer 4 to the extended bus A. The application of this control signal is carried out in accordance with the frame synchronizing signal, which has been separated by the frame synchronous separation circuit 5, by means of a timing control-signal application circuit 8 connected to the output side of the memory 3. Processing in the MPU 40 is executed in accordance with this control signal. The timing of sector-division recording in the disk device 22 is controlled by a timing control-signal separating circuit 26, which separates the above-mentioned control signal from the code string supplied to the disk recording circuit 21.

Similarly, with regard to playback, the output side of the disk playback circuit 23 is provided with a timing control-signal application circuit 27 for annexing a four- to eight-bit control signal instead of the frame synchronizing signal. Processing in the MPU 40 is executed in accordance with this signal applied by the circuit 27. In addition, the formation of the above-mentioned blank portion is carried out in accordance with the control signal separated, by a timing control-signal separating circuit 17, from the code string outputted by the buffer 13.

Thus, in accordance with the arrangement described above, the overall system configuration can be simplified though the amount of code recorded/reproduced is slightly increased in comparison with the embodiment of FIG. 1.

In the first and second embodiments described above, the frame synchronizing code FS of each frame, the synchronizing identification code HS and the error-check code (ECC) are deleted at the time of recording in the disk device 22. An arrangement can be adopted in which, in addition to these codes, unnecessary packets per se are also deleted. The details of a third embodiment for achieving this will now be described.

In a case where a still-picture broadcast is recorded in a disk device or the like, it is inefficient to record all of the packets sent in real-time. The reason is that many blank packets (ineffective packets in which there is no image data, control data and audio data) are recorded in a case where the composition of a broadcast program is such that there is no change in the picture for some time after a single still picture is sent, or in a case where the compression rate is high.

In the third embodiment, it is also assumed that the still-picture broadcast is made in the form shown in FIG. 4, in which HS and HC are header portions situated ahead of the packet data. The header HS contains a synchronous code SYNC (which includes information indicating the type of service), and the header HC contains ID information which indicates whether the type of data contiguous to this header is image data, control data for program configuration, or audio data.

To determine whether a packet is effective as far as the apparatus is concerned, it will suffice to examine the headers HS, HC in each packet. More specifically, the headers HS, HC are checked, and if the result is that the main information which follows these headers is neither image data, control data for program configuration nor audio data, then it is decided that the particular packet is an ineffective (meaningless) blank packet.

Figure 8:
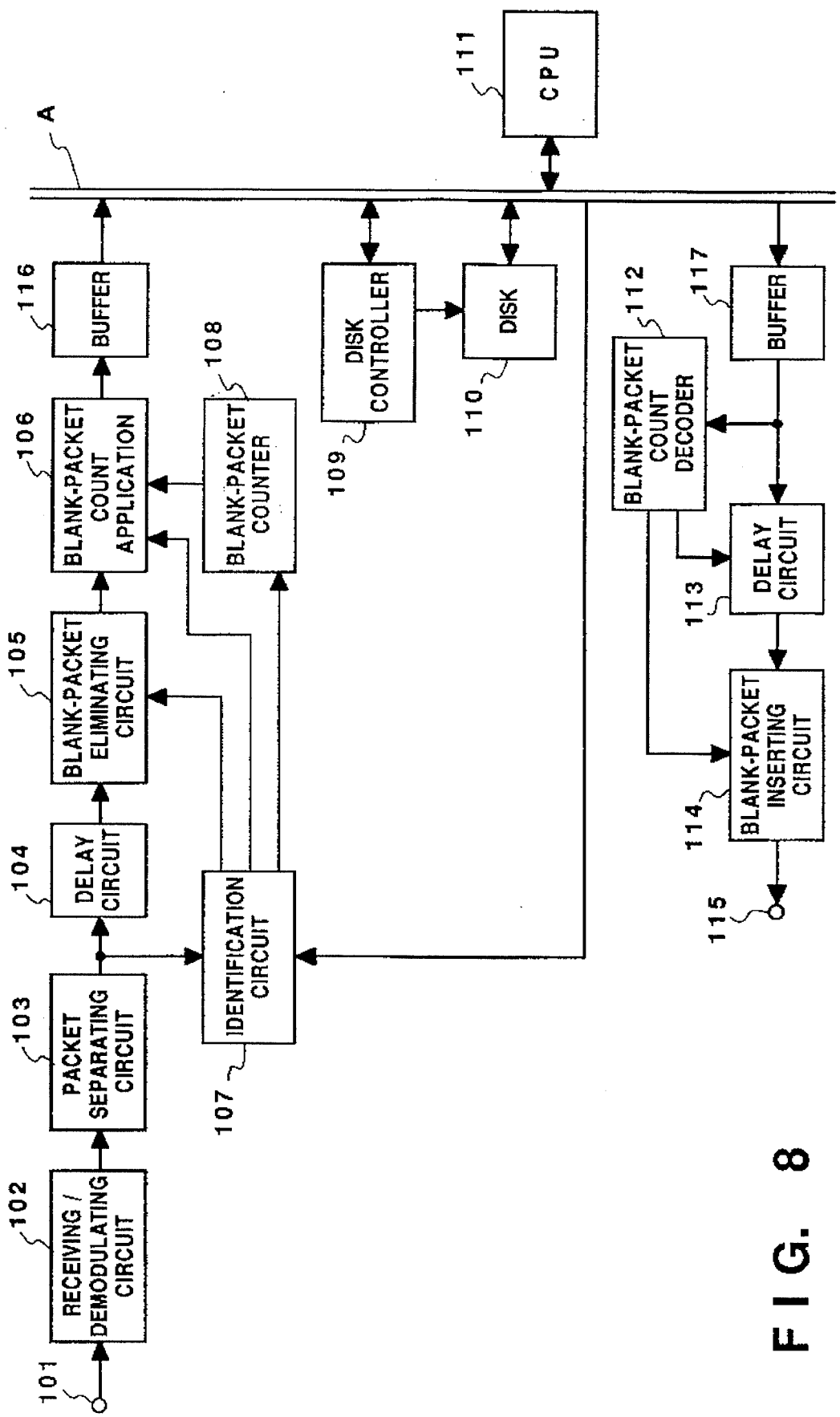
FIG. 8 is a block diagram illustrating a third embodiment of an information recording apparatus.

FIG. 8 is a block diagram illustrating the third embodiment of the apparatus according to the present invention. The operation of this apparatus will be described below.

A digital broadcast accepted by the apparatus via an input terminal 101 is received and demodulated by a receiving/demodulating circuit 102. Since the demodulated digital data is a continuous bit stream, the individual packets are separated in a separating circuit 103. An identification circuit 107 determines the service and the kind of each packet and, based upon the results of this determination, controls other circuits. It should be noted that codes indicating the types of packets that are effective for the apparatus have been stored beforehand in the identification circuit 107. In this embodiment, whether the packet data which is the service code of a still-picture broadcast accompanied by audio is identified from the header HS of the transmitted packet, and whether the packet which is an audio-related packet or an image-related packet is identified from the header HC. In all other cases a packet is judged to be one ineffective for the apparatus and is processed as a blank packet. An example of a service code other than that of a still-picture broadcast accompanied by audio is a facsimile-broadcast code.

In a case where the identification circuit 107 determines that the received data is a packet of a still-picture broadcast accompanied by audio, the circuit 107 sends a signal indicative of this fact to a blank-packet eliminating circuit 105, a circuit 106 which applies information indicative of the number of blank packets, and a blank-packet counter 108. The blank-packet eliminating circuit 105 and the information applying circuit 106 do not execute processing if the aforementioned signal enters from the identification circuit 107. In other words, a packet of interest separated by the packet separating circuit 103 is written in a buffer 116 directly if the aforementioned signal from the identification circuit 107 enters the circuits 105 and 106. Upon receiving the aforementioned signal from the identification circuit 108, the number of blank packets counted thus far by the blank-packet counter 108 is reset.

When the identification circuit 107 identifies a packet of interest as being a blank packet rather than the aforementioned still-picture broadcast packet, the circuit 107 delivers a signal indicative of this fact to the blank-packet eliminating circuit 105, the circuit 106 which applies information indicative of the number of blank packets, and the blank-packet counter 108. Upon receiving this signal, the blank-packet eliminating circuit 105 treats data that arrives from a delay circuit 104 as being ineffective and does not output this blank-packet data to the circuitry on its output side. Upon receiving a signal from the identification circuit 107 indicating that the packet of interest is a blank packet, the blank-packet counter 108 is incremented by one. Accordingly, if blank packets continue to enter, all of these blank packets are eliminated, and the number of blank packets eliminated is counted by the blank-packet counter 108. Thus, when a packet of a still-picture broadcast accompanied by audio is received following the reception of blank packets, the information applying circuit 106 accepts from the blank-packet counter 108 the count recorded thus far and writes this value in the buffer 116 as packet-format data. In this case, a code which makes it possible at playback to identify this packet as being a blank packet is annexed to the headers HS, HC, and the number of blank packets is stored at a predetermined position in the main information contiguous to the header HC. Meanwhile, since the packet of the still picture and accompanying audio has been held in the delay circuit 104, this packet does not vanish. Accordingly, after the counted value of blank packets has been stored in the buffer 116, the received packet of the still picture and accompanying audio is written in the buffer 116. After a CPU 111 applies predetermined processing for recording to the packet data that has been written in the buffer 116, the CPU performs control in such a manner that the data thus processed is written in a disk device 110 via a disk control circuit 109.

At the time of playback, the CPU 111 sequentially reads in the packets, which have been recorded on the disk 110, via the extended bus A, and then writes these packets in a buffer 117. A decoder 112, which decodes information indicative of the number of blank packets, examines the headers of a packet written in the buffer 117. If this packet is the packet of a still-picture broadcast accompanied by audio, the decoder 112 sends a signal indicative of this fact to a blank-packet inserting circuit 114. Upon receiving this signal, the blank-packet inserting circuit 114 delivers, from an output terminal 115, a packet obtained via a delay circuit 113. If it is determined that the data written in the buffer 117 is data which includes the count of blank packets, the decoder 112 decodes the count of blank packets and instructs the blank-packet inserting circuit 114 to produce and output blank packets the number of which is equivalent to the value of the count. It should be noted that the decoder 112 causes the packet of the still picture and accompanying audio reproduced next to be delayed by the delay circuit 113 until completion of the playback and output of the blank packets. The blank packets outputted from the output terminal 115 have practically the same information of the received packets strings, and these blank packets are accepted by a playback unit (not shown) to be played back as video and audio.

Figure 9:
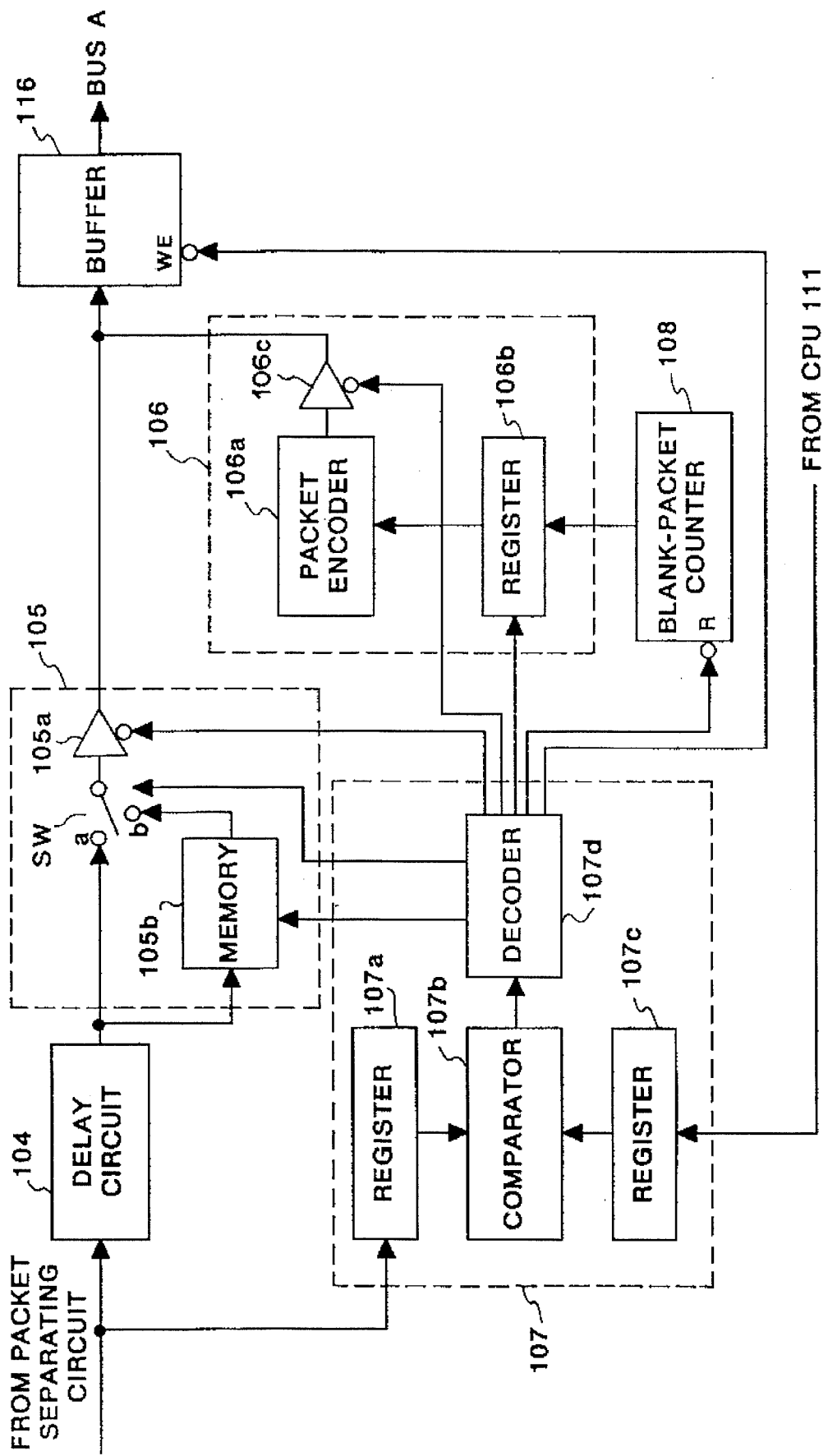
FIG. 9 is a detailed block diagram showing an identification circuit and peripheral circuitry according to the third embodiment.

The details of the identification circuit 107 and of circuitry peripheral thereto according to the third embodiment is illustrated in FIG. 9 and the operation thereof will now be described.

First, prior to the reception of data, and in order to record a still picture accompanied by audio, the CPU 111 sets, in a register 107c within the identification circuit 107, data which makes it possible to identify which header is that for the still picture and accompanying data when the header is inputted. The data to be set is designated by the operator using a keyboard or control panel, neither of which are shown. Accordingly, depending upon the particular case, when the data for receiving a facsimile broadcast is set, the present apparatus serves as an apparatus for recording and reproducing a packet of the facsimile broadcast.

When the data has been set in the register 107c and recording has started, the headers HS, HC of the packets successively outputted by the packet separation circuit 103 are accepted by a register 107a. A comparator 107b compares the items of data latched in the registers 107a, 107b and determines whether a packet of interest is a packet of a still-picture broadcast with audio. A decoder 107d receives a signal, which is indicative of the results of the comparison, from the comparator 107b and outputs, to each of a number of components, a corresponding signal at the corresponding timing. More specifically, if it is determined that a packet is a packet of a still-picture broadcast with audio, the decoder 107d outputs a signal instructing that a switch SW in the blank-packet eliminating circuit 105 is to select an input terminal a, as well as a signal which enables a gate 105a, and outputs a signal so as to disable the gate 106C. Further, the decoder 107d enables a write-enable terminal (WE) in the buffer 116 so that the received packet is written directly into the buffer 116. In addition, the decoder 107d outputs a reset signal to the blank-packet counter 108.

If a signal which indicates that the packet of interest is a blank packet, namely one which is not effective as far as the apparatus is concerned, enters from the comparator 107b, the decoder 107d disables the gate 105a and a gate 106c in the information applying circuit 106 and outputs a signal which disables the write-enable terminal of the buffer 116. The arrangement is such that the blank-packet counter 108 is incremented at this time. This processing is repeated as long as blank packets continue to enter.

Next, in a case where a packet of a still-picture broadcast accompanied by audio is received after a succession of blank packets, the decoder 107d causes the packet of interest to be stored in a memory 105b within the blank-packet eliminating circuit 105, at which time the blank-packet counter 108 transfers the recorded count to a register 106b. A packet encoder 106a forms a dummy packet which includes the number of blank packets latched in the register 106b. The decoder 107d enables the gate 106c and terminal WE in the buffer 116, whereby the dummy packet formed by the packet encoder 106a is written in the buffer 116. At this time the dummy packet written in the buffer 116 is no different from an ordinary packet, as shown in FIG. 10. However, a service code, which indicates that the particular packet is a blank packet, is added to the header HS, and the value of the count latched in the register 106b is inserted at a suitable position in the main information. Next, the decoder 107d causes the switch SW to select an input terminal b, disables the gate 106c, enables the gate 105a and enables the write-enable terminal of the buffer 116 so that the packet of the still picture with audio stored in the memory 105b is written in the buffer 116.

In accordance with the third embodiment, as described above, the arrangement is such that if consecutive blank packets not effective for the apparatus are received, information indicating the number of these consecutive blank packets is stored in memory. This makes it possible to store a broadcast program on the disk 110 very efficiently. At the time of reproduction, the same number of blank packets are inserted at substantially the same positions as in the data received, and these packets are played back. As a result, the program can be reproduced in an ordinary playback apparatus at exactly the same time as that required in time management at the time of broadcast. In addition, it is possible to prevent a situation in which the decoding capability of the decoders (an image decoder, audio decoder or decoder for other services) in the playback apparatus is exceeded.

In the first, second and third embodiments described above, broadcast still pictures that have been received are recorded, and the recorded still pictures are outputted to an apparatus capable of receiving and reproducing such a broadcast. However, the apparatus of the present invention itself can be adapted so as to reproduce a still-picture display and audio in a manner that can be understood by the operator. In such case, this could be achieved by providing the apparatus with its own CRT and speaker, and then it would suffice merely to reproduce directly the data recorded on the disk.

Further, in the first through third embodiments described above, the recording medium is a disk-shaped recording medium such as a magnetic or photomagnetic disk. However, this is not a limitation upon the present invention. For example, a magnetic tape can be employed as the recording medium without any problems whatsoever.

Though still pictures with accompanying audio are recorded in the foregoing embodiments, this is not a limitation upon the present invention. For example, it goes without saying that audio or video information alone or facsimile data can also be recorded.

The apparatus of the embodiments can be so adapted that a list of information recorded on the recording medium is displayed on a display unit or the like, thus enabling the operator to freely select and reproduce any item from the list.

In the first and second embodiments, an error-check code or the like contained in each packet is eliminated before the packet is recorded on the recording medium. In the third embodiment, recording is performed in such a manner that blank packets are deleted when received. Accordingly, it goes without saying that an apparatus having all of these features can be constructed in accordance with the present invention. Such an apparatus would make it possible to reduce further the amount of data per frame and to record a greater quantity of meaningful data on the recording medium.

The apparatus according to these embodiments is particularly advantageous for use in a data communication system of the type wherein the transfer rate of data to be transmitted has been decided in advance, as in the case of a broadcast.

As many apparently widely different embodiments of the present invention can be made without departing from the spirit and scope thereof, it is to be understood that the invention is not limited to the specific embodiments thereof except as defined in the appended claims.

What is claimed is:

1. An information recording and reproducing apparatus for receiving frame information that includes (i) a predetermined number of data packets, (ii) frame synchronizing information that includes synchronizing information for synchronizing frames, and (iii) frame-control information for indicating an arrangement of the data in each data packet, each of said data packets including (i) main information, and (ii) error-check code information for correcting errors in the main information, said apparatus comprising:

checking means for correcting errors in the main information based upon the error-check code information;

eliminating means for eliminating (i) the error-check code information from data packets corrected by said checking means and (ii) at least a portion of the frame synchronizing information from the frame information;

recording means for recording the information, which is obtained after the eliminating by said eliminating means, on a recording medium;

reading means for reading, from the recording medium, information recorded by said recording means;

information generating means for generating information corresponding to the error-check code information and frame synchronizing information eliminated by said eliminating means; and output means for outputting information that has been read by said reading means and information that has been generated by said information generating means, the output information corresponding to the received frame information.

2. The apparatus according to claim 1, wherein said frame information comprises picture information obtained by reception of a broadcast signal.

3. The apparatus according to claim 2, wherein said picture information comprises still-picture information.

4. The apparatus according to claim 3, wherein said still-picture information includes audio information.

5. The apparatus according to claim 1, wherein said eliminating means eliminates that portion of the frame synchronizing information which synchronizes frames, and that portion of the packet control information which synchronizes identification information.

6. An information recording and reproducing apparatus for receiving frame information that includes (i) a predetermined number of data packets, (ii) frame synchronizing information that includes synchronizing information for synchronizing frames, and (iii) frame-control information for indicating an arrangement of the data in each data packet, each of said data packets including (i) main information, (ii) error-check code information for correcting errors in the main information, and (iii) packet control information having both packet synchronizing information for synchronizing the data packet itself and attribute information for indicating attributes of the main information in each data packet, and for recordings information in the received frame information on a recording medium, and for reproducing and outputting the recorded information, said apparatus comprising:

checking means for correcting errors in the main information based upon the error-check code information;

eliminating means for eliminating (i) the error-check code information from data packets corrected by said checking means and (ii) at least a portion of both the frame synchronizing information and the packet control information from the frame information;

recording means for recording the information which is obtained after the eliminating by said eliminating means on the recording medium;

reading means for reading, from the recording medium, information recorded by said recording means;

information reproducing means for reproducing information corresponding to the information eliminated by said eliminating means; and output means for outputting information that has been read by said reading means and information that has been reproduced by said information reproducing means, the output information corresponding to the received frame information.

7. The apparatus according to claim 6, wherein said frame information comprises information obtained by reception of a broadcast signal.

8. The apparatus according to claim 7, wherein said picture information comprises still-picture information.

9. The apparatus according to claim 8, wherein said still-picture information includes audio information.

10. An information recording apparatus for receiving information, in the form of data packets, and for recording information in the received information on a recording medium, said apparatus comprising:

discriminating means for discriminating whether a data packet is (i) an effective packet that includes useful data, or (ii) an ineffective packet;

counting means for counting ineffective packets in an interval during Which data packets have been discriminated to be ineffective packets by said discriminating means;

recording means for successively recording, on the recording medium, (i) data in data packets discriminated to be effective packets by said discriminating means, as well as (ii) a counted value of ineffective packets counted by said counting means, without recording the ineffective packets;

reading means for reading, from the recording medium, information recorded by said recording means; and reproducing means for reproducing, in the form of data packets, the received information, including reproducing the ineffective packets by using the counted value of ineffective packets recorded by said recording means and read by said reading means, wherein the received information includes (i) synchronizing identification information for synchronizing the data packet attribute information for indicating an attribute of the data in each data packet.

11. The apparatus according to claim 10, further comprising setting means for designating reference data used by said discriminating means in order to discriminate whether a data packet is an effective packet or an ineffective packet.

12. An information recording apparatus for receiving information, in the form of data packets, and for recording information in the received information on a recording medium, said apparatus comprising:

discriminating means for discriminating whether a data packet is (i) an effective packet that includes useful data, or (ii) an ineffective packet;

counting means for counting ineffective packets in an interval during which data packets have been discriminated to be ineffective packets by said discriminating means;

recording means for successively recording, on the recording medium, (i) data in data packets discriminated to be effective packets by said discriminating means, as well as (ii) a counted value of ineffective packets counted by said counting means, Without recording the ineffective packets;

reading means for reading, from the recording medium, information recorded by said recording means; and reproducing means for reproducing, in the form of data packets, the received information, including reproducing the ineffective packets by using the counted value of ineffective packets recorded by said recording means and read by said reading means, wherein a received data packet includes identification information, and wherein when it is determined, based upon the identification information, that data in the data packet is data related to a still picture with accompanying audio, said discriminating means discriminates that the data packet is an effective packet, the data packet being discriminated as an ineffective packet in all other cases.

13. An information recording apparatus for receiving information, in the form of data packets, and for recording information in the received information on a recording medium, said apparatus comprising:

discriminating means for discriminating whether a data packet is (i) an effective packet that includes useful data, or ii) an ineffective packet;

counting means for Counting ineffective packets in an interval during which data packets have been discriminated to be ineffective packets by said discriminating means;

recording means for successively recording, on the recording medium, (i) data in data packets discriminated to be effective packets by said discriminating means, as well as ii) a counted value of ineffective packets counted by said counting means, without recording the ineffective packets;

reading means for reading, from the recording medium, information recorded by said recording means; and reproducing means for reproducing, in the form of data packets, the received information, including reproducing the ineffective packets by using the counted value of ineffective packets recorded by said recording means and read by said reading means, wherein said recording means records on the recording medium a dummy packet that includes (i) the counted value of ineffective packets, and (ii) information for identifying that the counted value is included in the dummy packet.

14. An information recording apparatus for receiving, in the form of data packets, information that includes main information as well as identification information to identify the main information, and for recording information in the received information on a recording medium, said apparatus comprising:

discriminating means for discriminating, based upon the identification information, whether a data packet is (i) an effective packet that possesses useful data, or (ii) an ineffective packet;

counting means for counting ineffective packets in an interval during which data packets have been discriminated to be ineffective packets by said discriminating means;

recording means for successively recording on the recording medium, (i) data in data packets discriminated to be effective packets by said discriminating means, as well as (ii) a counted value of ineffective packets counted by said counting means, without recording the ineffective packets;

reading means for successively reading, from the recording medium, information recorded by said recording means; and output means for (i) generating ineffective packets in a number equivalent to the counted value of ineffective packets recorded by said recording means and read by said reading means, (ii) inserting the generated ineffective packets at positions where ineffective packets existed in the received information, and (iii) successively outputting the generated ineffective packets, wherein the identification information includes (i) synchronizing identification information for synchronizing the data packet itself and for indicating the type of information, and (ii) attribute information for indicating an attribute of the main information in each data packet.

15. The apparatus according to claim 14, further comprising setting means for designating reference data used by said discriminating means in order to discriminate whether a data packet is an effective packet or an ineffective packet.

16. An information recording apparatus for receiving, in the form of data packets, information that includes main information as well as identification information to identify the main information, and for recording information in the received information on a recording medium, said apparatus comprising:

discriminating means for discriminating, based upon the identification information, whether a data packet is (i) an effective packet that possesses useful data, or (ii) an ineffective packet;

counting means for counting ineffective packets in an interval during which data packets have been discriminated to be ineffective packets by said discriminating means;

recording means for successively recording, on the recording medium, (i) data in data packets discriminated to be effective packets by said discriminating means, as well as (ii) a counted value of ineffective packets counted by said counting means, without recording the ineffective packets;

reading means for successively reading, from the recording medium, information recorded by said recording means; and output means for (i) generating ineffective packets in a number equivalent to the counted value of ineffective packets recorded by said recording means and read by said reading means, (ii) inserting the generated ineffective packets at positions where ineffective packets existed in the received information, and (iii) successively outputting the generated ineffective packets, wherein when it is determined, based upon the identification information in a received data packet, that data in the data packet is data related to a still picture with accompanying audio, said discriminating means discriminates that the data packet is an effective packet, the data packet being discriminated as an ineffective packet in all other cases.

17. An information recording apparatus for receiving, in the form of data packets, information that includes main information as well as identification information to identify the main information, and for recording information in the received information on a recording medium, said apparatus comprising:

discriminating means for discriminating, based upon the identification information, whether a data packet is (i) an effective packet that possesses useful data, or (ii) an ineffective packet;

counting means for counting ineffective packets in an interval during which data packets have been discriminated to be ineffective packets by said discriminating means:

recording means for successively recording, on the recording medium, (i) data in data packets discriminated to be effective packets by said discriminating means, as well as (ii) a counted value of ineffective packets counted by said counting means, without recording the ineffective packets;

reading means for successively reading, from the recording medium, information recorded by said recording means; and output means for (i) generating ineffective packets in a number equivalent to the counted value of ineffective packets recorded by said recording means and read by said reading means, (ii) inserting the generated ineffective packets at positions where ineffective packets existed in the received information, and (iii) successively outputting the generated ineffective packets, wherein said recording means records on the recording medium a dummy packet which includes (i) the counted value of ineffective packets, and (ii) information for identifying that the counted value is included in the dummy packet.

18. An information recording apparatus for receiving, in the form of data packets, information that includes main information as well as identification information to identify the main information, and for recording information in the received information on a recording medium, said apparatus comprising:

discriminating means for discriminating, based upon the identification information, whether a data packet is (i) an effective packet that possesses useful data, or (ii) an ineffective packet;

counting means for counting ineffective packets in an interval during which data packets have been discriminated to be ineffective packets by said discriminating means;

recording means for successively recording, on the recording medium, (i) data in data packets discriminated to be effective packets by said discriminating means, as well as (ii) a counted value of ineffective packets counted by said counting means, without recording the ineffective packets;

reading means for successively reading, from the recording medium, information recorded by said recording means; and output means for (i) generating ineffective packets in a number equivalent to the counted value of ineffective packets recorded by said recording means and read by said reading means, (ii) inserting the generated ineffective packets at positions where ineffective packets existed in the received information, and (iii) successively outputting the generated ineffective packets, wherein said output means includes:

second discriminating means for examining the identification information of each packet read by said reading means, and for discriminating whether the packet is an effective packet or a packet in which the counted value of ineffective packets has been stored;

first output control means for outputting a packet in response to said second discriminating means discriminating that the packet is an effective packet;

ineffective-packet generating means for generating ineffective packets in a number equivalent to said counted value of ineffective packets in response to said second discriminating means discriminating that the packet is a packet in which the counted value of ineffective packets has been stored; and second output control means for outputting the ineffective packets generated by said ineffective-packet generating means.

19. An information recording apparatus for receiving, in the form of data packets, information that includes (i) main information, (ii) error-check code information for correcting errors in the main information, and (iii) identification information to identify the main information, and for recording information in the received information on a recording medium, said apparatus comprising:

error-check means for correcting errors in the main information of data packets based upon the error-check code information;

discriminating means for discriminating, based upon the identification information, whether a received data packet is (i) an effective packet that possesses useful data, or (ii) an ineffective packet;

counting means for counting ineffective packets in an interval during which data packets have been discriminated to be ineffective packets by said discriminating means;

eliminating means for eliminating the error-check code information in data packets discriminated to be effective packets by said discriminating means and corrected by said error-check means;

recording means for successively recording, on the recording medium, (i) information from which the error-check code information has been eliminated, as well as (ii) a counted value of ineffective packets counted by said counting means, without recording the ineffective packets;

reading means for reading, from the recording medium, information recorded by said recording means; and reproducing means for reproducing, in the form of data packets, the received information, including reproducing the ineffective packets and the effective packets having the error-check code information by using information, including the counted value of ineffective packets, recorded by said recording means and read by said reading means.

20. An information recording apparatus for receiving, in the form of packets, information that includes (i) main information, (ii) error-check code information for correcting errors in the main information, and (iii) identification information to identify the main information, and for recording information in the received information on a recording medium, said apparatus comprising:

error-check means for correcting errors in the main information of packets based upon the error-check code information;

first discriminating means for discriminating, based upon the identification information, whether a received packet is (i) an effective packet that possesses useful data, or (ii) an ineffective packet;

counting means for counting ineffective packets in an interval during which packets have been discriminated to be ineffective packets by said first discriminating means;

eliminating means for eliminating the error-check code information in packets discriminated to be effective packets by said first discriminating means and corrected by said error-check means;

recording means for successively recording, on the recording medium, (i) information from which the error-check code information has been eliminated by said eliminating means, as well as (ii) a counted value of ineffective packets counted by said counting means;

reading means for successively reading, from the recording medium, information recorded by said recording means;

second discriminating means for discriminating whether the information read by said reading means is (i) data that has been corrected by said error-check means, or (ii) the counted value of ineffective packets counted by said counting means;

data packet generating means for, in response to said second discriminating means discriminating that the read information is the data that has been corrected by said error-check means, generating error-check code information corresponding to the read information, and for generating one data packet with the generated error-check code annexed thereto;

ineffective packet generating means for, in response to said second discriminating means discriminating that the read information is the counted value of ineffective packets, generating ineffective packets, the number of which is equal to the counted value of ineffective packets; and output means for outputting the data packets generated by said data packet generating means and the ineffective packets generated by said ineffective packet generating means in accordance with a sequence in which the information has been read by said reading means.

* * * * *

UNITED STATES PATENT AND TRADEMARK OFFICE
CERTIFICATE OF CORRECTION

PATENT NO. : 5,544,176
DATED : August 6, 1996
INVENTOR(S) : AKIO FUJII, ET AL.

It is certified that error appears in the above-indentified patent and that said Letters Patent is hereby corrected as shown below:

Column 4,
    line 30, "the, error-check" should read --the error-check--; and

Column 13,
    line 40, "recordings" should read --recording--.

Column 14,
    line 13, "Which" should read --which--; and
    line 53, "Without" should read --without--.

Column 15,
    line 11, "Counting" should read --counting--.

Signed and Sealed this

Twenty-eighth Day of January, 1997

Attest:

BRUCE LEHMAN

Attesting Officer    Commissioner of Patents and Trademarks